(12) United States Patent
Poulsen

(10) Patent No.: US 11,050,435 B1
(45) Date of Patent: Jun. 29, 2021

(54) SAMPLE RATE CONVERSION CIRCUIT WITH NOISE SHAPING MODULATION

(71) Applicant: SYNAPTICS INCORPORATED, San Jose, CA (US)

(72) Inventor: Jens Kristian Poulsen, Kitchener (CA)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 16/858,491

(22) Filed: Apr. 24, 2020

(51) Int. Cl.
*H03M 3/00* (2006.01)
*H03M 3/04* (2006.01)

(52) U.S. Cl.
CPC ........... *H03M 3/498* (2013.01); *H03M 3/042* (2013.01); *H03M 3/344* (2013.01); *H03M 3/402* (2013.01); *H03M 3/414* (2013.01)

(58) Field of Classification Search
CPC ...... H03M 3/498; H03M 3/344; H03M 3/042; H03M 3/414; H03M 3/402; H03M 3/50; H03M 7/3004; H03H 17/0416
USPC .......................................... 341/61, 143, 155
See application file for complete search history.

(56) References Cited

U.S. PATENT DOCUMENTS

| | | | | |
|---|---|---|---|---|
| 5,646,621 A * | 7/1997 | Cabler | ..................... | G06F 7/026 341/143 |
| 5,786,778 A * | 7/1998 | Adams | ................... | H03H 17/06 341/61 |
| 5,802,118 A * | 9/1998 | Bliss | ................ | G11B 20/10009 375/350 |
| 6,032,284 A * | 2/2000 | Bliss | ................ | G11B 20/10037 341/59 |
| 6,208,671 B1 * | 3/2001 | Paulos | ............... | H03H 17/0628 341/61 |
| 6,215,423 B1 * | 4/2001 | May | .................... | H03H 17/0614 341/143 |
| 6,542,094 B1 * | 4/2003 | Venkitachalam | .. | H03H 17/0614 341/61 |
| 6,668,429 B2 * | 12/2003 | Fujisawa | .............. | A47C 31/023 24/297 |
| 7,113,122 B2 * | 9/2006 | Gangstoe | .............. | H03M 3/462 341/155 |
| 7,292,174 B2 * | 11/2007 | Gangstoe | .............. | H03M 3/462 341/155 |
| 7,394,870 B2 * | 7/2008 | Chien | ..................... | H04L 7/042 375/150 |
| 7,436,333 B2 * | 10/2008 | Forman | .............. | H03H 17/0628 341/61 |

(Continued)

*Primary Examiner* — Jean B Jeanglaude
(74) *Attorney, Agent, or Firm* — Haynes and Boone, LLP

(57) ABSTRACT

Systems and methods for low power sample rate conversion are based on a noise shaping technique. A sample rate conversion circuit includes a clock synchronization circuit configured to receive an input sample sequence at a first sample rate and generate a valid sample sequence that is sampled at a second sample rate different from the first sample rate. The valid sample sequence may include valid samples from a registered sequence sampled at an over-sampled rate greater than the first sample rate with invalid samples in the registered sequence being excluded from the valid sample sequence. The sample rate conversion circuit also includes a noise shaping circuit coupled to the clock synchronization circuit and configured to encode the valid sample sequence into a noise-shaped output sequence at the second sample rate by suppressing quantization noise from the valid sample sequence.

20 Claims, 11 Drawing Sheets

(56) References Cited

U.S. PATENT DOCUMENTS

| | | | | |
|---|---|---|---|---|
| 7,649,484 B1* | 1/2010 | Wegener | H03M 7/30 | 341/155 |
| 7,933,315 B2* | 4/2011 | Li | H04B 1/707 | 375/150 |
| 8,582,577 B2* | 11/2013 | Thi | H04N 21/2383 | 370/392 |
| 2004/0028159 A1* | 2/2004 | Abdelilah | H04L 7/0062 | 375/350 |
| 2004/0196926 A1* | 10/2004 | Chien | H04L 7/042 | 375/316 |
| 2006/0158363 A1* | 7/2006 | Gangsto | G01R 19/2509 | 341/155 |
| 2006/0284753 A1* | 12/2006 | Gangstoe | G01R 19/2509 | 341/155 |
| 2007/0091992 A1* | 4/2007 | Dowling | H04L 25/45 | 375/229 |
| 2008/0049826 A1* | 2/2008 | Agazzi | H04L 25/03987 | 375/233 |
| 2008/0068234 A1* | 3/2008 | Forman | H03H 17/0628 | 341/61 |
| 2010/0283654 A1* | 11/2010 | Waheed | G04F 10/005 | 341/166 |
| 2014/0043177 A1* | 2/2014 | Pagnanelli | H03M 1/0836 | 341/143 |
| 2015/0061911 A1* | 3/2015 | Pagnanelli | H03M 3/358 | 341/144 |
| 2015/0171890 A1* | 6/2015 | Pagnanelli | H03M 1/0836 | 341/143 |

* cited by examiner

SAMPLE RATE CONVERSION CIRCUIT WITH NOISE SHAPING MODULATION

TECHNICAL FIELD

The present application relates generally to systems and methods for digital signal processing, and more particularly to, a sample rate conversion circuit with noise shaping modulation.

BACKGROUND

The conversion of digital signals to different sample rates suitable for various digital components and processes is well known. For example, it is common for a digital signal processing system to use different sampling rates depending on a desired signal quality, required bandwidth, latency requirements, processing economy, available silicon area and other considerations. In audio processing systems, different sample rates may be used to achieve low latency and high performance. Conventional systems that perform sample rate conversions to support different clock domains are typically implemented with polyphase filters employing multipliers and adders to obtain the desired sample frequencies. These multiplication operations, however, have a significantly high computational footprint, which requires higher complexity and higher power consumption. In view of the foregoing, there is a continued need for improved systems and methods for sample rate conversion, where lower complexity and lower power consumption are achievable.

SUMMARY

Systems and methods are disclosed herein for providing low power asynchronous and synchronous sample rate conversion based on a noise shaping technique. In various embodiments, system for sample rate conversion includes a modulation source configured to modulate an input analog signal into an input sample sequence. In some aspects, the system also includes a clock synchronization circuit configured to receive an input sample sequence at a first sample rate and generate a valid sample sequence that is sampled at a second sample rate different from the first sample rate. In some aspects, the valid sample sequence includes valid samples from a registered sequence that is sampled at an oversampled rate greater than the first sample rate with invalid samples in the registered sequence being excluded from the valid sample sequence.

In some embodiments, the system also includes a noise shaping circuit coupled to the clock synchronization circuit and configured to encode the valid sample sequence into a noise-shaped output sequence at the second sample rate by suppressing quantization noise from the valid sample sequence. In an embodiment, the clock synchronization circuit includes a plurality of registers connected in series and configured to sample the input sample sequence at the oversampled rate for successive clock edges to provide the registered sequence. The clock synchronization circuit also includes a sequence circuit coupled to the plurality of registers and configured to detect transitions in values of the registered sequence and identify the values at the transitions as the invalid samples for filtration. In an embodiment, the sequence circuit may include a sequence detect circuit configured to detect the invalid samples at a first clock edge of the successive clock edges and the valid samples at a second clock edge of the successive clock edges that is subsequent to the first clock edge. The sequence circuit also may include a sequence filter configured to filter the invalid samples with the valid samples being passed to the valid sample sequence. In an embodiment, the plurality of registers is clocked at the oversampled rate and the sequence circuit is clocked at the second sample rate. In an embodiment, the noise shaping circuit includes a delta-sigma modulator, in which the delta-sigma modulator is a kth-order delta-sigma modulator, where k is greater than 1. In an embodiment, the system includes a pulse density modulator configured to modulate an input analog signal into a sampled signal as a sequence of single bits at the first sample rate. In an embodiment, the system also includes a pre-amplifier coupled to an input to the pulse density modulator and configured to amplify the input analog signal into an amplified analog signal. In some aspects, the pulse density modulator modulates the amplified analog signal into the sampled signal. The system also includes an oversampled interpolation filter coupled to an output of the pulse density modulator and configured to remove out-of-band aliased images from the sampled signal using one or more internal delays and arithmetic operations in the oversampled interpolation filter that may operate at different sample frequencies. In an embodiment, the system also includes a decimation filter coupled to the noise shaping circuit and configured to downsample the noise-shaped output sequence at the second sample rate and provide a pulse code modulated signal with a downsampled rate by decimating the second sample rate by a factor of L, where L is a positive integer. In another embodiment, the system includes a decimation filter coupled to the pulse density modulator and configured to downsample the sampled signal into a decimated signal by decimating the first sample rate by a factor of N, where N is a positive integer. The system also includes an interpolation filter coupled to the decimation filter and to an input to the clock synchronization circuit and configured to produce the input sample sequence at the first sample rate by interpolating the decimated signal by the factor of N. In an embodiment, the system includes a delta-sigma modulator configured to produce a sampled signal as a sequence of multi-bit words at the first sample rate divided by a factor of N, where N is a positive integer. The system also includes an interpolation filter coupled to the delta-sigma modulator and to an input to the clock synchronization circuit and configured to produce the input sample sequence at the first sample rate by interpolating the sampled signal by the factor of N. In another embodiment, the system includes a decimation filter coupled to the noise shaping circuit and configured to downsample the noise-shaped output sequence into a pulse code modulated signal by decimating the second sample rate by a factor of L, where L is a positive integer.

In various embodiments, a sample rate converter includes a modulation source configured to modulate an input analog signal into an input sample sequence. The sample rate converter also includes a clock synchronization circuit configured to receive the input sample sequence at a first sample rate and generate a valid sample sequence that is sampled at a second sample rate different from the first sample rate. In some aspects, the valid sample sequence comprising valid samples from a sampled sequence that is sampled at an oversampled rate greater than the first sample rate with invalid samples in the sampled sequence being excluded from the valid sample sequence. The sample rate converter also includes a noise shaping circuit coupled to the clock synchronization circuit and configured to encode the valid sample sequence into a noise-shaped output sequence at the second sample rate by suppressing quantization noise from the valid sample sequence.

In some embodiments, the modulation source is a pulse density modulator configured to produce a modulated signal from the input analog signal. In an embodiment, the sample rate converter includes a pre-amplifier coupled to an input to the pulse density modulator and configured to amplify the input analog signal into an amplified analog signal, in which the pulse density modulator modulates the amplified analog signal into the modulated signal. The sample rate converter may include an oversampled interpolation filter coupled to an output of the pulse density modulator and configured to produce the input sample sequence by removing out-of-band aliased images from the modulated signal using one or more internal delays and arithmetic operations in the oversampled interpolation filter that operate at different sample frequencies. In an embodiment, the sample rate converter includes a decimation filter coupled to the noise shaping circuit and configured to downsample the noise-shaped output sequence at the second sample rate and provide a pulse code modulated signal with a downsampled rate by decimating the second sample rate by a factor of M, where M is a positive integer. In another embodiment, the sample rate converter includes a decimation filter coupled to the pulse density modulator and configured to downsample the modulated signal into a decimated signal by decimating the first sample rate by a factor of N, where N is a positive integer. The sample rate converter also includes an interpolation filter coupled to the decimation filter and to an input to the clock synchronization circuit and configured to produce the input sample sequence at the first sample rate by interpolating the decimated signal by the factor of N. In an embodiment, the modulation source is a delta-sigma modulator that is configured to produce a modulated signal from the input analog signal, and further comprising an interpolation filter coupled to the delta-sigma modulator and to an input to the clock synchronization circuit and configured to produce the input sample sequence at the first sample rate by interpolating the modulated signal by a factor of N, where N is a positive integer. In an embodiment, the sample rate converter includes a decimation filter coupled to the noise shaping circuit and configured to downsample the noise-shaped output sequence into a pulse code modulated signal by decimating the second sample rate by a factor of L, where L is a positive integer.

In various embodiments, a method of sample rate conversion includes modulating an input signal from an analog source into a sampled signal as a sequence of single bits or as a sequence of multi-bit words. The method includes filtering the sampled signal into a filtered sample sequence by decimation and interpolation or by oversampled interpolation. The method includes transferring the filtered sample sequence from a first sample rate into a valid sample sequence comprising valid samples with invalid samples being excluded from the valid sample sequence. In some aspects, the valid sample sequence is sampled at a second sample rate different from the first sample rate. The method includes encoding the valid sample sequence into a noise-shaped output sequence at the second sample rate with quantization noise suppressed from the valid sample sequence. The method also includes providing the noise-shaped output sequence to a load such as an audio system receiving the samples for further processing.

The scope of the present disclosure is defined by the claims, which are incorporated into this section by reference. A more complete understanding of embodiments of the present disclosure will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Aspects of the disclosure and their advantages can be better understood with reference to the following drawings and the detailed description that follows. It should be appreciated that like reference numerals are used to identify like elements illustrated in one or more of the figures, wherein showings therein are for purposes of illustrating embodiments of the present disclosure and not for purposes of limiting the same. The components in the drawings are not necessarily to scale, emphasis instead being placed upon clearly illustrating the principles of the present disclosure.

DETAILED DESCRIPTION

Figure 1:
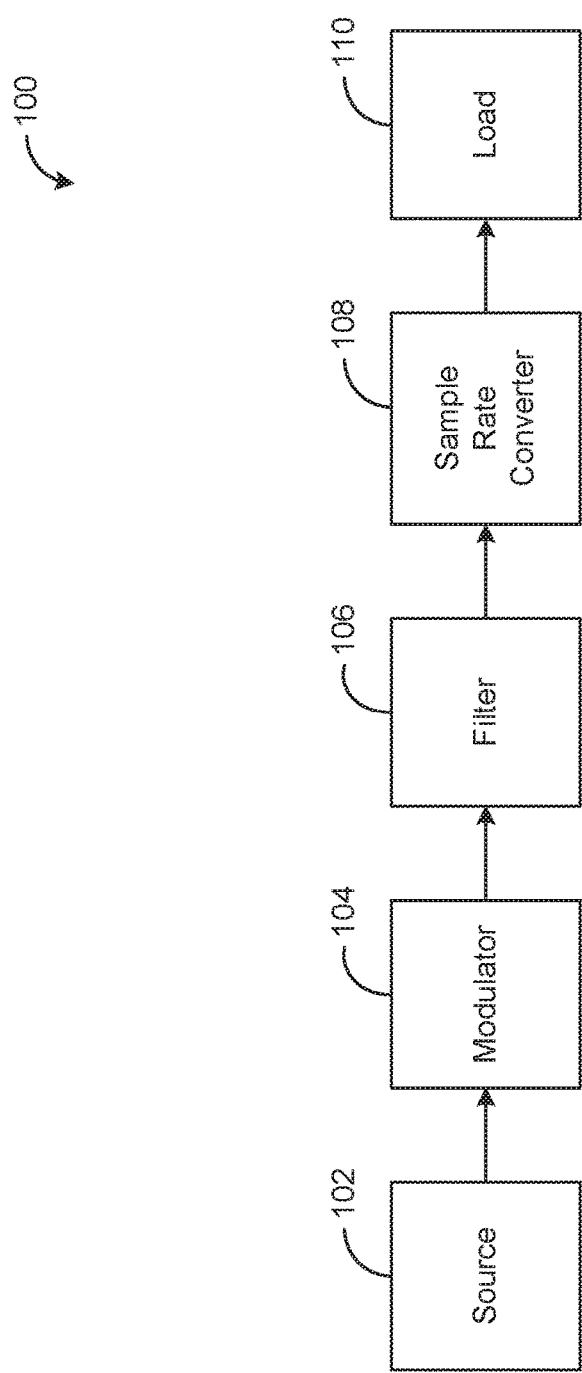
FIG. 1 illustrates a simplified block diagram of an example sample rate conversion system, in accordance with one or more embodiments.

In accordance with various embodiments of the present disclosure, systems and methods for achieving low power sample rate conversion using a noise shaping technique are disclosed. In various embodiments, a sample rate conversion circuit includes a clock synchronization circuit that is configured to receive an input sample sequence at a first sample rate and generate a valid sample sequence that is sampled at a second sample rate different from the first sample rate. In some aspects, the valid sample sequence includes valid samples from a registered sequence that is sampled at an oversampled rate greater than the first sample rate with invalid samples in the registered sequence being excluded from the valid sample sequence. The sample rate conversion circuit also includes a noise shaping circuit that is coupled to the clock synchronization circuit and is configured to encode the valid sample sequence into a noise-shaped output sequence at the second sample rate by suppressing quantization noise from the valid sample sequence and noise shaping the output signal.

The subject technology provides sample rate conversion with noise shaping modulation according to novel techniques, including: (1) a technique that increases the reliability in transferring values between two clock domains and without occasionally risking faulty values; and (2) a technique that performs sample rate conversion performed based on a delta-sigma modulator noise shaping loop. For example, in the first technique, the present disclosure provides for register transfers between different clock domains that solves a fundamental technical problem in ensuring data is reliably transferred from on clock domain to another clock domain. In the second technique, the delta-sigma modulator noise shaping loop allows sample rate conversion to be implemented without the use of multipliers, resulting in a significantly low computational footprint. Thus, due to the simplicity of this noise shaping technique, the delta-sigma modulator for asynchronous sample rate conversion can have many applications, including but not limited to, digital signal processing applications, audio processing applications, power distribution applications, video processing applications, and the like. Additionally, the delta-sigma modulator can also be used as a replacement for synchronous sample rate conversion techniques, where a lower complexity and lower power consumption are desired.

The subject technology addresses the need for asynchronous and synchronous sample rate conversion without requiring the use of multiplier operations and structures, thus lowering the computational footprint, reducing the structure complexity, and more importantly, decreasing the power consumption in sample rate conversion systems. The subject technology also offers lower distortion, better rejection of aliased mirror images, and highly superior Signal-to-Noise Ratio (SNR).

The subject technology can advantageously support multiple PDIM sample rates and by proper extension, also be used for PCM sample rate conversion. For example, the subject technology may be used for conversion between PDM to PDDM systems operating at different sample rates, or for conversion between PCI to PCM, PDM to PCI and PCM to PDM systems. The subject technology may not be limited by certain sample rates and may operate within entire systems using fewer clock domains, resulting in further lowering the power consumption.

FIG. 1 illustrates a simplified block diagram of an example sample rate conversion system 100, in accordance with one or more embodiments. In various embodiments, the sample rate conversion system 100 includes source 102, modulator 104, filter 106, sample rate converter 108 and load 110. In FIG. 1, the source 102 is coupled to an input to the modulator 104, which is then coupled to an input to the filter 106. The filter 106 is coupled to an input to the sample rate converter 108, which is then coupled to the load 110. Not all of the depicted components may be used, however, and one or more implementations may include additional components not shown in the figure. Variations in the arrangement and type of the components may be made without departing from the scope of the claims set forth herein. Additional components, different components, or fewer components may be provided.

In an embodiment, the source 102 may be implemented by an audio input device, such as a microphone. In some embodiments, the modulator 104 may be implemented by a delta-sigma modulator to produce a sequence of multi-bit words. In other embodiments, the modulation 104 may be implemented by a pulse-density modulator to produce a sequence of single bits. In an embodiment, the modulator 104 may be implemented by a pulse-width modulator (PWM). In some embodiments, the filter 106 may be implemented by a decimator and an interpolator for PDM source applications. In other embodiments, the filter 106 may be implemented by an oversampled interpolator for PDM source applications. For example, in some embodiments, the oversampled interpolator may include an oversampled interpolation filter as described in related U.S. patent application Ser. No. 16/177,308, filed on Oct. 31, 2018, which is incorporated by reference herein. In some embodiments, the filter 106 may be implemented by an interpolator for PCM source applications. In various embodiments, the sample rate converter 108 may be implemented by a combination of a clock synchronization circuit and a noise shaping circuit. In an embodiment, the load 110 may be implemented by an audio system such as an audio processing system. The output from the audio processing system may be fed to a speaker as final output.

In operation, the source 102 implemented as a microphone can receive an input analog signal such as an audible signal. The source 102 supplies the input analog signal to the modulator 104. The input analog signal is converted to a sampled signal using the modulator 104, in which the modulator 104 may be implemented as a PDM or a PCM, depending on implementation. The sampled signal is then filtered into a filtered signal by the filter 106. In some embodiments, the sampled signal may be filtered to remove any unwanted aliased mirror images with the filter 106. The filtered signal is then fed to the sample rate converter 108 to produce a noise-shaped output sequence signal, where the filtered signal is first transferred between clock domains to remove any metastability and improve signal reliability and then the sample rate is changed through a noise-shaping loop. The noise-shaped output sequence signal can then be used, for example, by the load 110 implemented as an audio processing system followed by a speaker.

Figure 2:
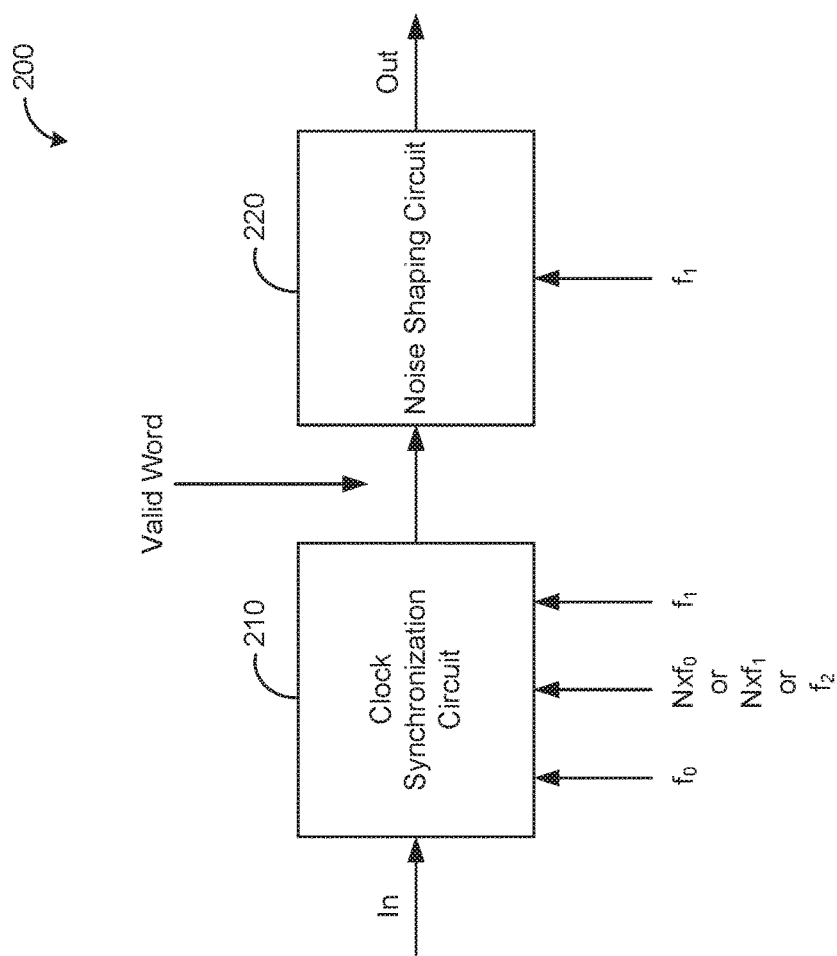
FIG. 2 illustrates a simplified block diagram of a sample rate converter in the sample rate conversion system of FIG. 1, in accordance with one or more embodiments.

FIG. 2 illustrates a simplified block diagram of a sample rate converter 200 in the sample rate conversion system 100 of FIG. 1, in accordance with one or more embodiments. The sample rater converter 200 is, or includes at least a portion of, the sample rate converter 108 of FIG. 1. The sample rate converter 200 includes a clock synchronization circuit 210 and a noise shaping circuit 220. Not all of the depicted components may be used, however, and one or more implementations may include additional components not shown in the figure. Variations in the arrangement and type of the components may be made without departing from the scope of the claims set forth herein. Additional components, different components, or fewer components may be provided.

In various embodiments, the clock synchronization circuit 210 is adapted to receive an input sample sequence (depicted as "In") at a first sample rate (depicted as "$f_0$") and generate a valid sample sequence (depicted as "Valid Word") that is sampled at a second sample rate different from the first sample rate (depicted as "$f_1$"). In order to eliminate (or at least reduce) the number of transfer errors prior to sample rate conversion, the input sample sequence and accompanying input clock line are sampled at a faster rate than required to ensure the input sample sequence line has been stable for more than one clock period. This would validate that subsequent samples have satisfied all setup/hold time conditions, ensuring the output of valid word values. In some embodiments, the valid sample sequence includes valid samples from a registered sequence that is sampled at an oversampled rate greater than the first sample rate (depicted as "$N \times f_0$ or $N \times f_1$ or $f_2$") with invalid samples in the registered sequence being excluded from the valid sample sequence.

In various embodiments, the noise shaping circuit 220 is coupled to the clock synchronization circuit 210 and is adapted to encode the valid sample sequence into a noise-shaped output sequence (depicted as "Out") at the second sample rate by suppressing quantization noise from the valid sample sequence. After the clock synchronization circuit 210 has obtained a sequence of valid values sampled at another clock rate (e.g., $N \times f_1$) than the output rate in the first clock domain (e.g., $f_1$), the noise shaping circuit 220 can be used to filter out discontinuities in the sequence to ensure the output sequence does not contain any unwanted noise (e.g., signal spikes). In an embodiment, the noise shaping circuit 220 may be implemented to provide a two-level or multi-level output equal to or different from the word length of the input sample sequence. In various embodiments, the noise shaping circuit 220 is implemented by a delta-sigma modulator. The delta-sigma modulator can filter the input values (e.g., the sequence of sample values from the clock synchronization circuit 210) and filter the output sequence, thereby providing the noise-shaped output sequence.

Delta-sigma modulators are known in the art for their noise shaping application. Delta-sigma modulators are commonly used as one-bit converters due to their ability to spread quantization noise away from the desired signal band to higher frequencies. In some embodiments, the delta-sigma modulator is a kth-order delta-sigma modulator, where k is greater than 1. A high-order delta-sigma modulator can give sufficient noise shaping capabilities while providing, for example, a one-bit sample rate converted signal. In other embodiments, the delta-sigma modulator may be implemented entirely with Canonical Signed Digit (CSD) arithmetic instead of using multipliers to form weighted integrators inside the loop, thus reducing the power consumption significantly and obtaining higher performance over existing implementation approaches of the delta-sigma modulator. In this instance, the multipliers can be replaced with simple adders and subtracters of the original or shifted binary words, thereby reducing the power consumption and complexity of the circuit.

The noise shaping circuit 220 implemented with the delta-sigma modulator provides for an effective means of providing sample rate conversion and simultaneously providing an output with the same or a different number of quantization levels as compared to the input, thus simultaneously solving two technical problems at once. For example, the noise shaping circuit 220 exploits the noise-shaping properties of a delta-sigma modulator to remove quantization noise both in the amplitude (feedback path) and time domain (forward path). Both the Forward Transfer Function (FTF) and the Noise Transfer Function (NTF) of a delta-sigma modulator can attenuate out-of-band noise and thereby the noise shaping circuit 220 can achieve a very effective suppression of noise due to the digitization process and the randomness due to the difference in sample point between the two sequences (e.g., the input sample sequence on the forward path and the feedback sequence on the feedback path). In other words, when the forward path in noise shaping circuit 220 skips one sample, the next sample increases considerably more than normally, providing a spike in the input to the delta-sigma modulator, that will then be reflected in adjustments in the feedback path. Therefore, the noise shaping circuit 220 is self-regulating and can obtain a high SNR with a relatively simple topology.

Figure 3:
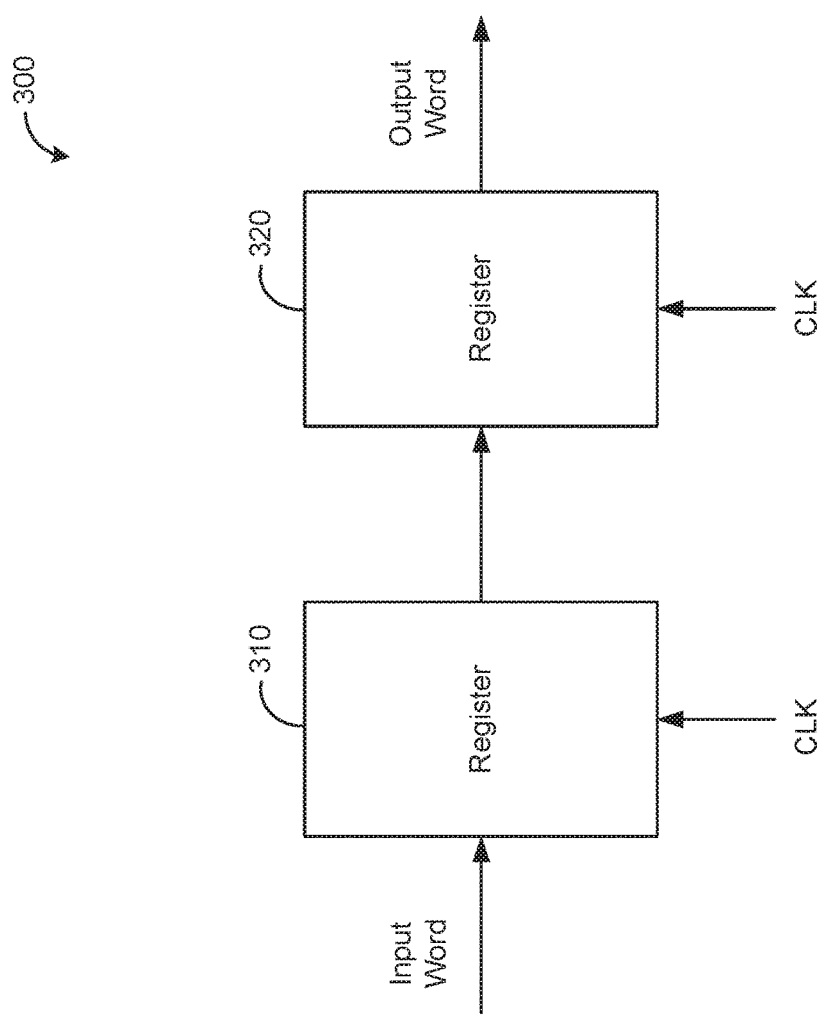
FIG. 3 illustrates a simplified block diagram of an example register transfer circuit, in accordance with one or more embodiments.

FIG. 3 illustrates a simplified block diagram of a standard example register transfer circuit 300, in accordance with one or more embodiments. The register transfer circuit 300 includes a first register 310 and a second register 320. The first register 310 and the second register 320 are each sampled by a same clock domain (e.g., CLK). In an embodiment, the first register 310 and the second register 320 are implemented with one or more flip-flops. The flip-flops may include Delay (D) flip-flops, Set-Reset (SR) flip-flops, Toggle (T) flip-flops, JK flip-flops, among others. The first register 310 and the second register 320 may be synchronous to one another in some embodiments, or may be asynchronous to one another in other embodiments.

In operation, the first register 310 captures the value of an input signal (depicted as "In") at a definite portion of a clock, such as at the rising edge of the clock (e.g., CLK), provided that the input signal satisfies the corresponding setup/hold time conditions of the first register 310. Similarly, the second register 320 captures the value of the its input signal (represented as the output signal from the first register 310) at the rising edge of CLK provided that the registers are synchronous and the input signal satisfies the corresponding setup/hold time conditions of the second register 320. In this respect, each of the first register 310 and the second register 320 can store the captured value for at least one clock cycle, and any subsequent changes to the input data line are ignored (or not stored) until the next definite portion of the clock (e.g., the next rising edge).

A conventional approach to ensure against metastable issues is to read values twice through a double buffer, such as the topology of the register transfer circuit 300. By reading the values twice substantially ensures that the output values are stable. However, it is possible that the clock line may have changed, and one or more data lines (depicted as "Input Word") to either of the first register 310 or the second register 320 may have entered through an uncertain state, thereby producing invalid output data (depicted as "Output Word") for at least one clock period. Thus, even if all data values may be stable after a double-reading operation with the register transfer circuit 300, individual bits occasionally (depending on setup/hold time violations) may not represent valid words. In other words, an entire binary word may not be valid for a single clock period at the first register 310, even though all individual bits may be fully settled to a logical one or a logical zero at the second register 320. In this case, occasional transfer errors may occur due to the instability of some individual bits in the transfer between the first register 310 and the second register 320. This is a fundamental limitation of the register transfer circuit 300 when handling the transfer of data that is crossing multiple clock domains.

Figure 4A:
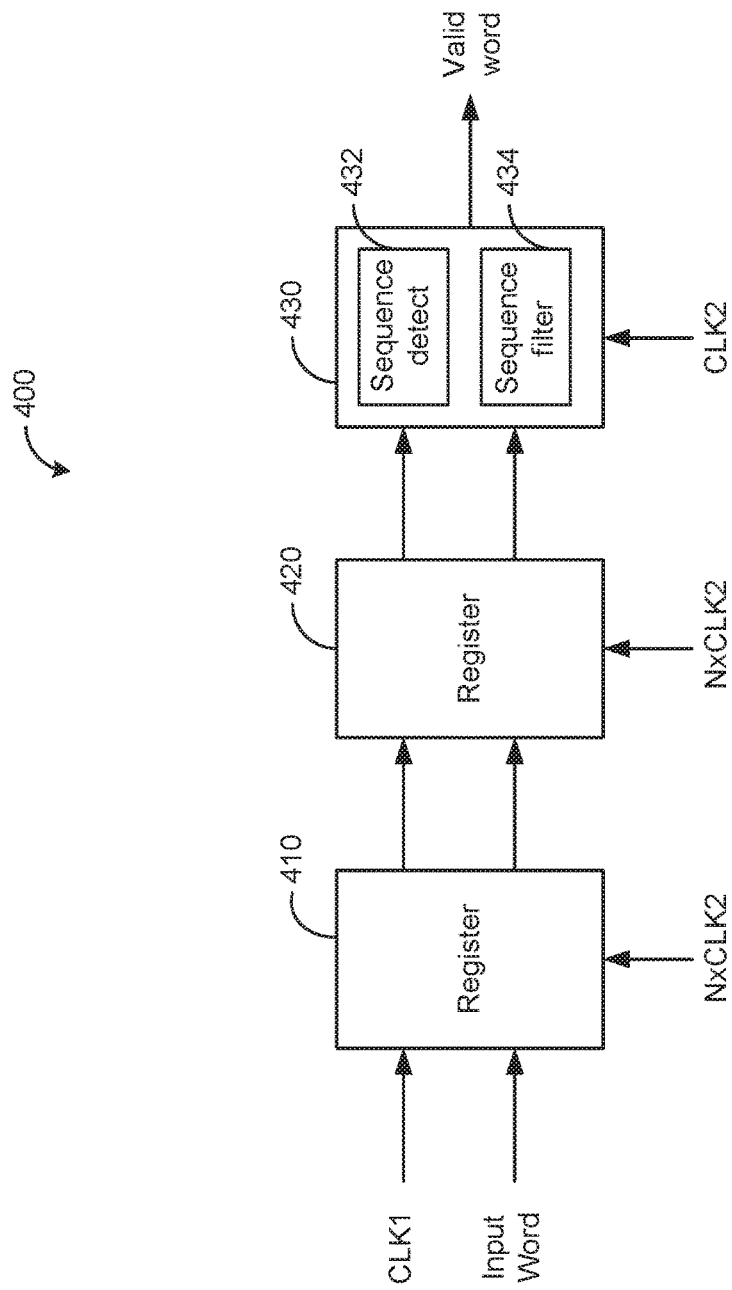
FIG. 4A illustrates a simplified block diagram of an example multi-clock domain register transfer circuit in the clock synchronization circuit of FIG. 2, in accordance with one or more embodiments.

FIG. 4A illustrates a simplified block diagram of an example multi-clock domain register transfer circuit 400 in the clock synchronization circuit 210 of FIG. 2, in accordance with one or more embodiments. The multi-clock domain register transfer circuit 400 is, or includes at least a portion of, the clock synchronization circuit 210 of FIG. 2.

In various embodiments, the multi-clock domain register transfer circuit 400 includes a first register 410 and a second register 420 connected in series with the first register 410 that are adapted to sample the input sample sequence (depicted as "Input Word") at the oversampled rate for successive clock edges to provide a registered sequence. In various embodiments, the registered sequence is obtained at the data line output of the second register 420. The multi-clock domain register transfer circuit 400 also includes a sequence circuit 430 that is coupled to the second register 420 and is adapted to detect transitions in values of the registered sequence and identify the values at the transitions as invalid samples to be filtered out.

In some embodiments, each of the first register 410 and the second register 420 is clocked at an oversampled rate (depicted as "N×CLK2") and the sequence circuit 430 is clocked at the second sample rate (depicted as "CLK2"). In FIG. 4A, the first register 410 and the second register 420 are implemented with an oversampled clock that is synchronous with clock, CLK2. In various embodiments, the oversampling is performed by increasing the synchronized clock by a factor of N, where N is a positive integer. For example, a sample clock with a sampling frequency of 44.1 kHz may be increased by a factor of 10 (N=10) to produce an oversampling clock with an oversampling rate of about 441 kHz (e.g., 10×44.1 kHz). In an embodiment, the first register 410 and the second register 420 may be implemented with an oversampled clock using N×CLK1 by reading back clock, CLK2. In other embodiments, the first register 410 and the second register 420 may be implemented with both clock edges of CLK2, respectively, for performing the oversamnpling of the input sample sequence. In still other embodiments, the multi-clock domain register transfer circuit 400 may sample clock, CLK2, by a similar circuit using clock, CLK1 or CLK1*N, where N is an integer, as reference to ensure all setup/hold times are valid. In yet other embodiment, a third clock source with frequency $f_2$ may be used to ensure the sampling of both data and clock in the first and second clock domain are sampled correctly by filtering out invalid values.

In various embodiments, the sequence circuit 430 includes a sequence detect circuit 432 and a sequence filter circuit 434. In an embodiment, the sequence detect circuit 432 is adapted to detect the invalid samples at a first clock edge of the successive clock edges and the valid samples at a second clock edge of the successive clock edges that is subsequent to the first clock edge. In an embodiment, the sequence filter circuit 434 is adapted to filter the invalid samples with the valid samples being passed to the valid sample sequence.

In an embodiment, the sequence circuit 430 with the sequence detect circuit 432 can detect a sequence of values on the clock line as a new data valid indicator. For example, the sequence detect circuit 432 may detect the following clock line sequence: {0, 1, 1}. In this example, since the {0, 1} transition in the clock line sequence indicates the start of a clock edge (e.g., rising edge from logical 0 to logical 1), the sequence detect circuit 432 determines that the additional {1} value in the clock line sequence is used to ensure all values in a data line sequence have been sampled for one additional clock period after the clock edge, thereby ensuring all setup/hold times have been satisfied. In other words, even if there was some metastability occurring during the {0, 1} clock transition, the metastability condition may no longer be valid because all data sequence values would have settled fully during the second clock edge denoted by the additional {1} value in the clock line sequence. In this respect, all invalid values can be filtered out, ensuring the output sequence contains only valid values.

In an embodiment, the sequence circuit 430 with the sequence filter circuit 434 can filter the output value. In some embodiments, the sequence detect circuit 432 may identify which output words are marked as invalid, such as by marking corresponding positions in the sequence as either "valid" or "not valid." For example, when the sequence detect circuit 432 detects that the output data line from the second register 420 contains the output sequence of {0, *0, *1, 1, 1, . . . }, the sequence detect circuit 432 may mark the sequence as {valid, not valid, not valid, valid, valid, . . . }. In this respect, the sequence filter circuit 434 can filter particular output words identified as "not valid" from the output sequence. In an embodiment, the sequence filter circuit 434 may read the identifier set by the sequence detect circuit 432. In some embodiments, the sequence detect circuit 432 may include a storage element (or clocked storage element such as a register) to facilitate the retention of the valid values in the sequence. This example assumed the input data changes on the rising clock edge, however, a similar function can be made that detected the input data change with respect to a falling clock edge or both clock edges in the case of dual-edge data transfers.

An example of the sequence detection and filtering is reproduced below, as follows:

{A, AA, X, B, B, B, . . . } Data line
{0, 0, 0, 1, 1, 11, . . . } Clock line
{A, A, (A), (A), B, B, B . . . } Output Sequence
{A, A, A, A, B, B, B . . . } Valid output sequence In the example above, the sequence detect circuit 432 may monitor the data line and the clock line to detect any invalid values in the data line at clock transitions in the clock line. The sequence detect circuit 432 may detect a clock transition sequence {0, 1} with a corresponding data value sequence {A, X}. The sequence detect circuit 432 may be adapted to identify these two values as invalid as denoted in the output sequence. In this respect, the sequence filter circuit 434 may be adapted to filter out these two values from the output sequence. The sequence detect circuit 432 may detect stable clock sequences such as {1, 0} and {1, 1} with corresponding data value sequences {A, A} and {B, B}, respectively. In this respect, the sequence detect circuit 432 may identify these values as valid values. The sequence filter circuit 434 may be adapted to pass these valid values to the valid output sequence (the same value is present at each clock edge until a new valid value is added). The multi-clock domain register transfer circuit 400 can basically assume that the values directly sampled on each side of the clock edge are not valid, because the setup/hold times may have been violated.

Figure 4B:
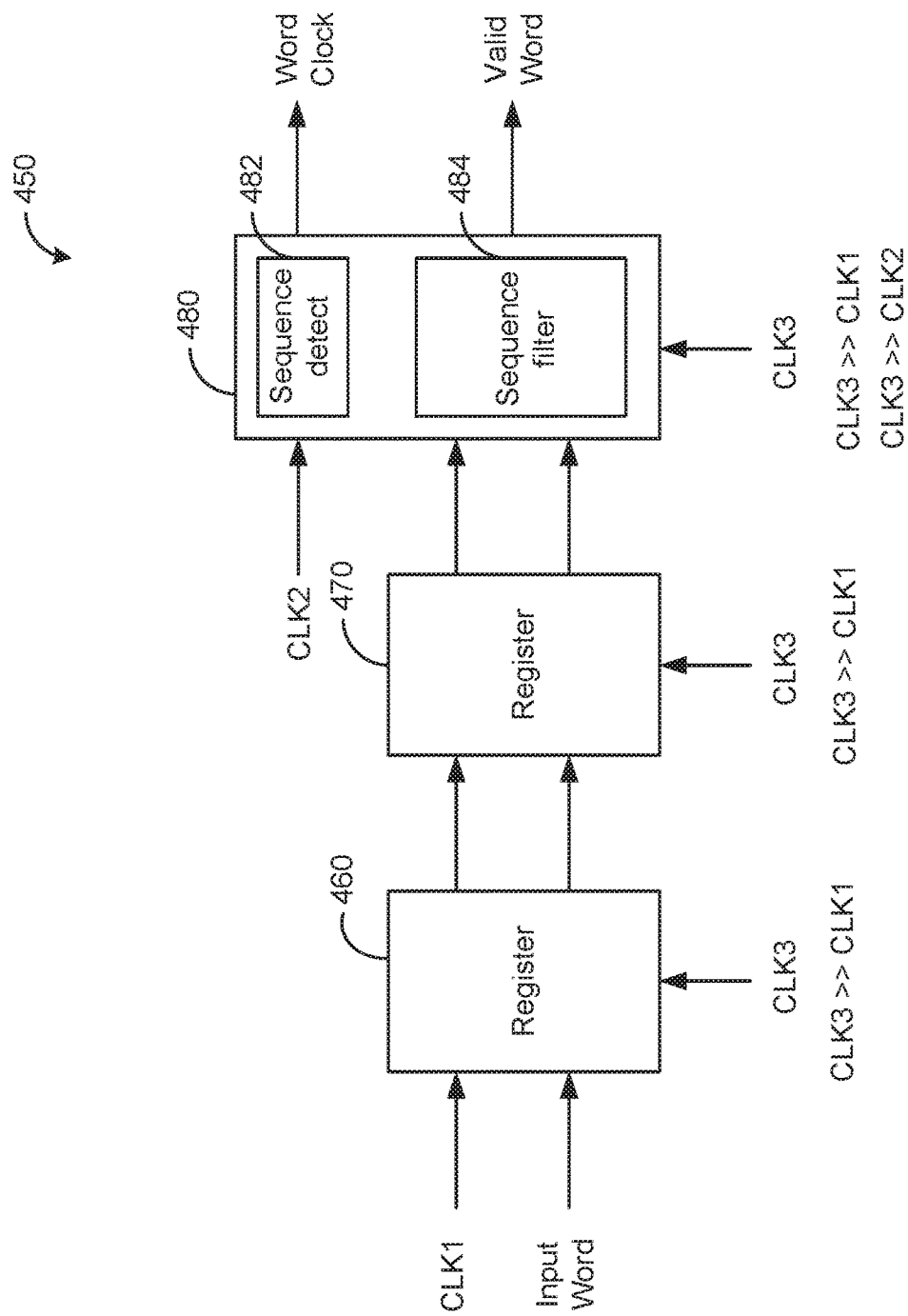
FIG. 4B illustrates a simplified block diagram of another example multi-clock domain register transfer circuit in the clock synchronization circuit 210 of FIG. 2, in accordance with one or more embodiments.

FIG. 4B illustrates a simplified block diagram of another example multi-clock domain register transfer circuit 450 in the clock synchronization circuit 210 of FIG. 2, in accordance with one or more embodiments. The multi-clock domain register transfer circuit 450 is, or includes at least a portion of, the clock synchronization circuit 210 of FIG. 2. In various embodiments, the multi-clock domain register transfer circuit 450 includes a first register 460 and a second register 470 connected in series with the first register 460 that are adapted to sample the input sample sequence (depicted as "Input Word") at an oversampled rate for successive clock edges to provide a registered sequence. In various embodiments, the registered sequence is obtained at the data line output of the second register 470. The multi-clock domain register transfer circuit 450 also includes a sequence circuit 480 that is coupled to the second register 470 and is adapted to detect transitions in values of the registered sequence and identify the values at the transitions as invalid samples to be filtered out.

In some embodiments, a third clock source with frequency, $f_2$, neither related to $f_0$ nor $f_1$, may be used to control the checking of the validity of the clock and data signals. In FIG. 4B, each of the first register 460, the second register 470 and the sequence circuit 480 is clocked at a third sample rate (depicted as "CLK3"). For instance, the first register 410 and the second register 420 are implemented with a third clock source with frequency $f_2$ that may be used to ensure the sampling of both data and clock in the first and second clock domains are sampled correctly by filtering out invalid values. In some embodiments, the frequency $f_2$ of the third clock, CLK3, is significantly greater than that of each of the first clock, CLK1, and the second clock, CLK2.

In various embodiments, the sequence circuit 480 includes a sequence detect circuit 482 and a sequence filter circuit 484. In an embodiment, the input to the sequence detect circuit 482 is coupled to the second clock source, CLK2. In this respect, the sequence detect circuit 482 can monitor CLK2 and is adapted to detect the invalid samples at a first clock edge of the successive clock edges and the valid samples at a second clock edge of the successive clock edges that is subsequent to the first clock edge. In an embodiment, the sequence circuit 480 with the sequence detect circuit 482 can detect a sequence of values on the clock line (e.g., CLK2) as a new data valid indicator. The sequence detect circuit 482 may drive a word clock output (depicted by "Word Clock") based on the input clock, CLK2, with clock cycles that correspond to valid word sequences. In an embodiment, the sequence filter circuit 484 is adapted to filter out invalid samples with valid samples being passed to a valid sample sequence (depicted as "Valid Word").

In another embodiment, the input to the sequence filter circuit 484 may exclusively include the data words from the second register 470, thus omitting the sampling of the clock signal (e.g., CLK1). In this case, the output data word values that have been sampled may be compared to previous data word values. In some aspects, if a new data word value is equivalent to a previous sampled value, the sequence filter circuit 484 can pass the new data word value as a valid sample in the valid sample sequence. In this respect, any transient conditions in the data words can be filtered out. An advantage of this approach is that it may not be necessary to have access to a clock signal indicating an event when changing the input data signal, thus a clock-less system such as a fully asynchronous system can be supported. In some aspects, the sequence circuit 480 may include an N-bit comparator that is equivalent to a length of the received samples (e.g., data words). The N-bit comparator can perform a comparison operation over the full data word length, which may include an increase in complexity and power consumption. For example, if the sequence filter circuit 484 receives an input sequence of {A, B, B, C, X, D, D, E, E}, the filtered output of the sequence filter circuit 484 may include a valid sample sequence of {<previous state>, <previous state>, B, B, B, B, D, D, E}.

Figure 5:
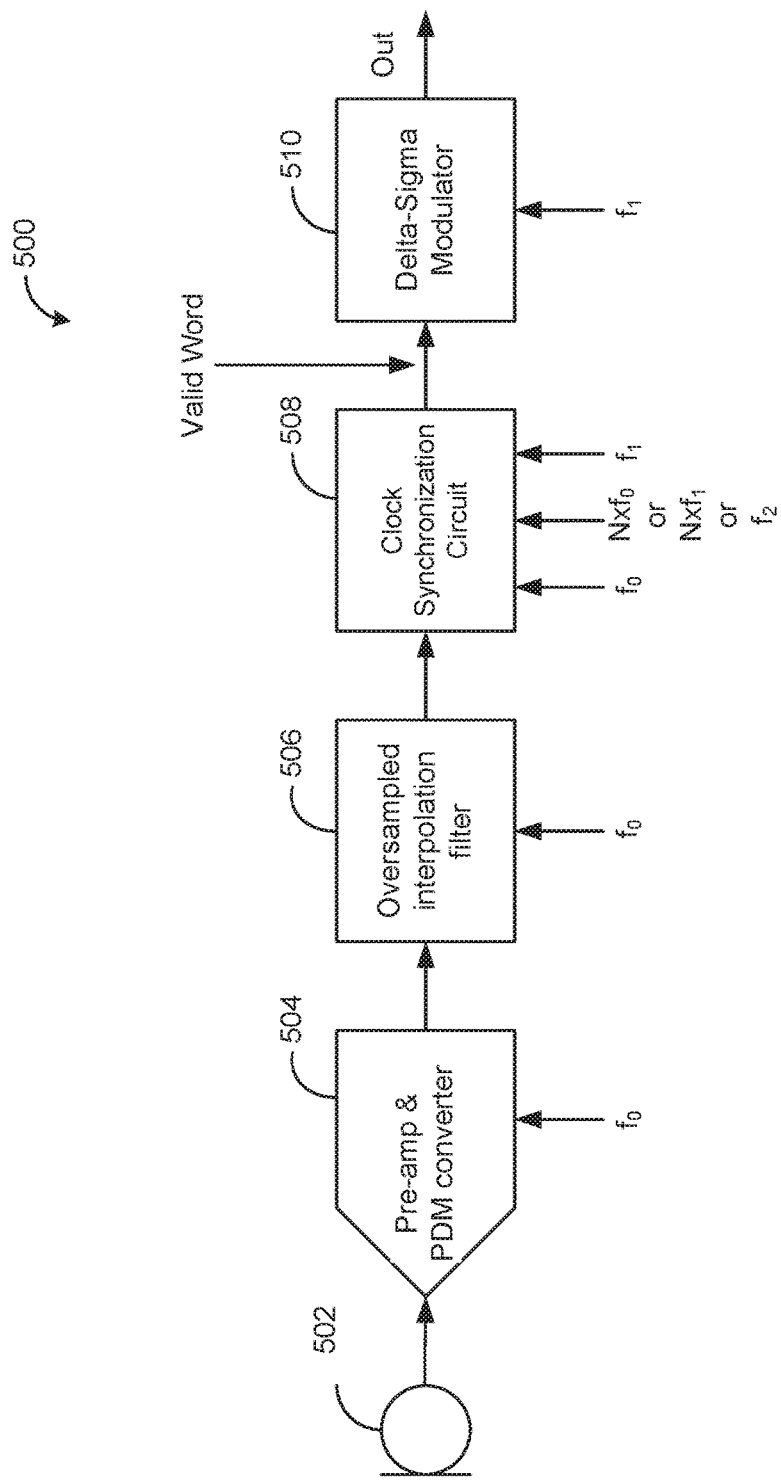
FIG. 5 illustrates a simplified block diagram of an example low power asynchronous sample rate conversion circuit with noise shaping modulation, in accordance with one or more embodiments.

FIG. 5 illustrates a simplified block diagram of an example low power asynchronous sample rate conversion circuit 500 with noise shaping modulation, in accordance with one or more embodiments. In various embodiments, the low power asynchronous sample rate conversion circuit 500 includes source 502, modulator 504, filter 506, clock synchronization circuit 508 and delta-sigma modulator 510. In FIG. 5, the source 502 is coupled to an input to the modulator 504, which is then coupled to an input to the filter 506. The filter 506 is coupled to an input to the clock synchronization circuit 508, which is then coupled to the delta-sigma modulator 510. Not all of the depicted components may be used, however, and one or more implementations may include additional components not shown in the figure. Variations in the arrangement and type of the components may be made without departing from the scope of the claims set forth herein. Additional components, different components, or fewer components may be provided.

In an embodiment, the source 502 may be implemented by an audio input device, such as a microphone or other audio sensor to sense environmental audible signals from one or more audible sources and generate corresponding electrical signals representing the sensed audible signal. In various embodiments, the output of the source 502 may be a digital oversampled bit stream, e.g. the output from a single-bit digital microphone, or an analog signal that is provided to a pre-amplifier (e.g., 504) and the modulator 504 (single-bit or multi-bit) to produce the digital oversampled audio signal. In various embodiments, the modulator 504 may be implemented by a delta-sigma modulator.

In some embodiments, the modulator 504 may be implemented by a pulse-density modulator to produce a sequence of single bits. In an embodiment, the modulator 504 includes a pre-amplifier (represented as a microphone preamplifier) coupled to an input to the pulse density modulator and configured to amplify an input analog signal from the source 502 into an amplified analog signal. In this respect, the pulse density modulator modulates the amplified analog signal into a modulated signal. In other embodiments, the modulator 504 may be implemented by a multi-bit delta-sigma modulator to produce a sequence of multi-bit words. In an embodiment, the modulator 504 may be implemented by a pulse-width modulator (PWM).

In various embodiments, the filter 506 is implemented by an oversampled interpolator for PDM source applications (hereinafter referred to as "oversampled interpolation filter 506"). The oversampled interpolation filter 506 is coupled to an output of the pulse density modulator and is adapted to remove out-of-band aliased images from the modulated signal using one or more internal delays and associated signal processing in the oversampled interpolation filter 506 that operate at different sample frequencies. The filter 506 may operate as a lowpass filter and with same input and output sample rates. In an embodiment, the oversampled interpolation filter 506 operates at the same sample rate as the output from the modulator 504, and low pass filters the output from the modulator 504. In various embodiments, the oversampled interpolation filter 506 has input and output sample frequencies that match the first sample rate (e.g., $f_0$)). The oversampled interpolation filter 506 may be implemented by multiple filter sections having delay elements of various lengths inside each filter section, i.e. each filter section includes N, N/2, N/4, etc., times the original delay elements of a first prototype filter section, so as to obtain the same frequency response as the original filter configuration operating at N, N/2, N/4 times the lower sample frequency, but still operating at the original input frequency of $f_0$. Furthermore, this filter configuration solves practical implementation problems, because all filter elements are updated at the high $f_0$ sample rate, thereby enabling an optimal group delay of the filters. In this case, the theoretical performance may be obtained without introducing extra delays due to a practical register transfer level implementation that often can give delays when transferring values between systems with different sample rates (e.g., different sample frequencies). In other embodiments, the filter 506 may be implemented by a decimator and an interpolator for PDM source applications. In still other embodiments, the filter 506 may be implemented by an interpolator for PCM source applications operating at an initial sample rate lower than the frequency, $f_0$.

In various embodiments, the clock synchronization circuit 508 and the delta-sigma modulator 510 correspond substantially to the clock synchronization circuit 210 and the noise shaping circuit 220 of FIG. 2, and therefore, the clock synchronization circuit 508 and the delta-sigma modulator 510 include substantially the same functionality and operation as the clock synchronization circuit 210 and the noise shaping circuit 220, respectively.

It will be appreciated that, for simplicity, some standard components are not shown in FIG. 5, for example, a microphone high-voltage pump used in microelectromechanical system (MEMS) microphones, low noise power supply unit, audio processing unit, digital-to-analog converter (DAC), speaker amplifier, a power source and other components of the low power asynchronous sample rate conversion circuit 500. These components are known to those skilled in the art and will be included in various practical system implementations, but have been omitted here for clarity in the showing the processing path.

Figure 6:
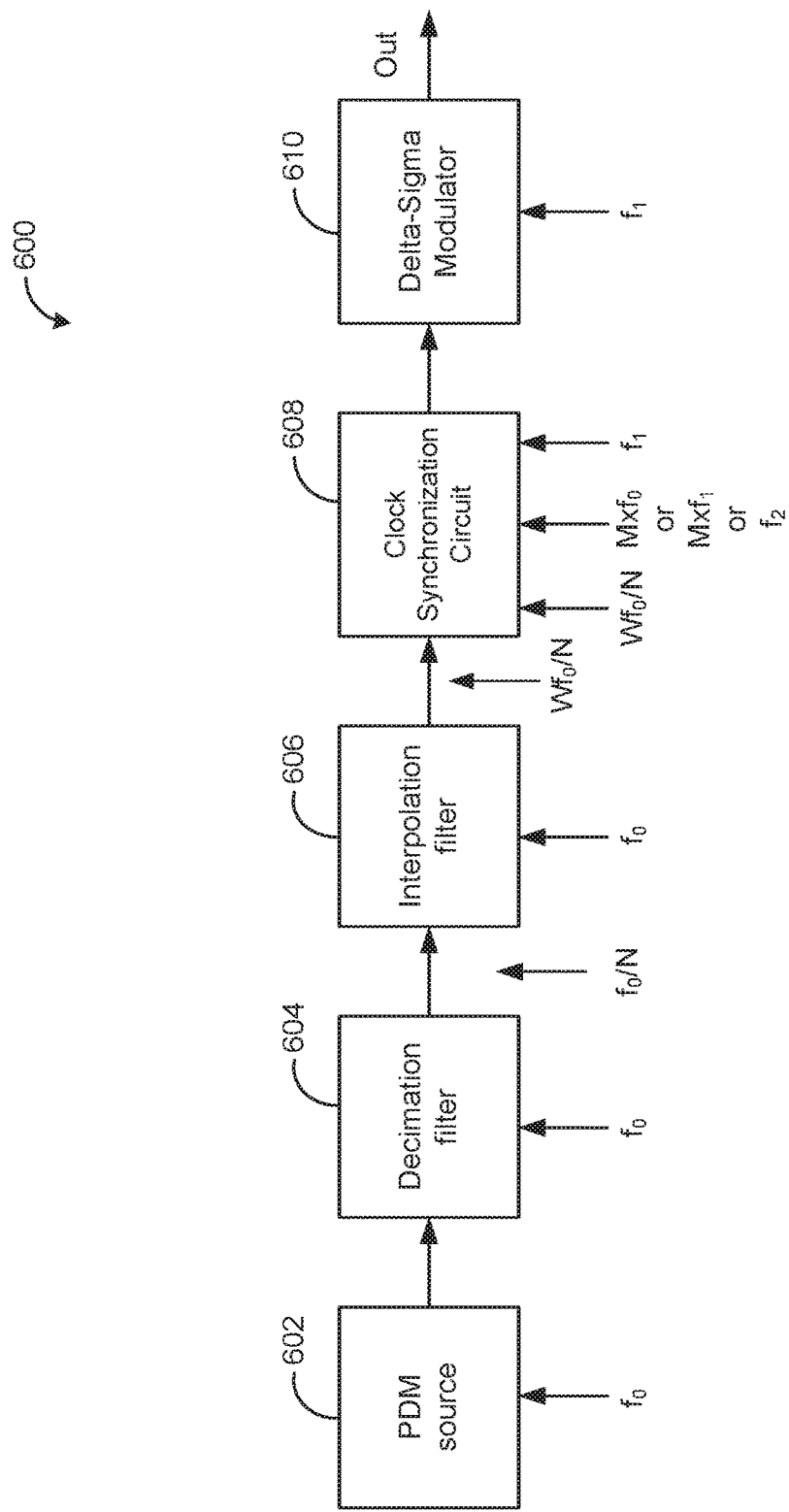
FIG. 6 illustrates a simplified block diagram of an example low power asynchronous sample rate conversion circuit for a Pulse-Density Modulation (PDM)-to-PDM conversion, in accordance with one or more embodiments.

FIG. 6 illustrates a simplified block diagram of an example low power asynchronous sample rate conversion circuit 600 for a PDM-to-PDM conversion, in accordance with one or more embodiments. In various embodiments, the low power asynchronous sample rate conversion circuit 600 includes modulator 602, decimation filter 604, interpolation filter 606, clock synchronization circuit 608 and delta-sigma modulator 610. In FIG. 6, the modulator 602 is coupled to an input to the decimation filter 604, which is then coupled to an input to the interpolation filter 606. The interpolation filter 606 is coupled to an input to the clock synchronization circuit 608, which is then coupled to the delta-sigma modulator 610. Given that the modulator 602, the clock synchronization circuit 608 and the delta-sigma modulator 610 correspond substantially to similar components in FIGS. 1, 2 and 5, only components that are unique to FIG. 6 will be discussed for brevity of explanation. Not all of the depicted components may be used, however, and one or more implementations may include additional components not shown in the figure. Variations in the arrangement and type of the components may be made without departing from the scope of the claims set forth herein. Additional components, different components, or fewer components may be provided.

In various embodiments, the decimation filter 604 is adapted to downsample an input sequence signal into a decimated signal by decimating the first sample rate (depicted as "$f_0$") by a factor of N (depicted as "$f_0/N$"), where N is a positive integer. For example, the digital audio signal is decimated to a lower sample rate by the decimation filter 604. As depicted in FIG. 6, the interpolation filter 606 is coupled to an output of the decimation filter 604 and to an input to the clock synchronization circuit 608. The clock synchronization unit 608 may be adapted to oversample the words from the interpolation filter 606 by a factor of at least one of: $\{M \times f_0, M \times f_1 \text{ or } f_2\}$, where $f_2$ is an arbitrary clock signal significantly (typically at least 5 times) higher than $f_0$, similarly, $M \geq 5$. The interpolation filter 606 is adapted to receive the decimated signal at the lower sample rate and produce an interpolated signal at the first sample rate by interpolating the decimated signal by the factor of W (depicted as "$Wf_0/N$"), which is then fed to the clock synchronization circuit 608. In this example, it is assumed N=W, however, it may be possible to use values of N and W that are different, without departing from the scope of the present disclosure. The filtering process by the decimation filter 604 and the interpolation filter 606 is included to ensure the input sequence signal is band limited to reduce (or minimize) occurrences of unwanted aliasing of noise when removing samples.

In some embodiments, the decimation filter 604 and the interpolation filter 606 may be implemented using multiplier-free, multi-stage Lattice Wave (LW) filters for minimal silicon area cost and minimal power consumption (i.e. removing all multipliers using CSD arithmetic). In other embodiments, the decimation filter 604 and the interpolation filter 606 may each include a plural number of filters operable to perform filtering at corresponding sample frequencies. In still other embodiments, the decimation filter 604 and the interpolation filter 606 may be replaced with an oversampled interpolation filter as described in FIG. 5. In an embodiment, the decimation filter 604 and the interpolation filter 606 may be implemented by Cascaded Integrator-Comb (CIC) filters (or referred to as "logenauer comb filters").

Figure 7:
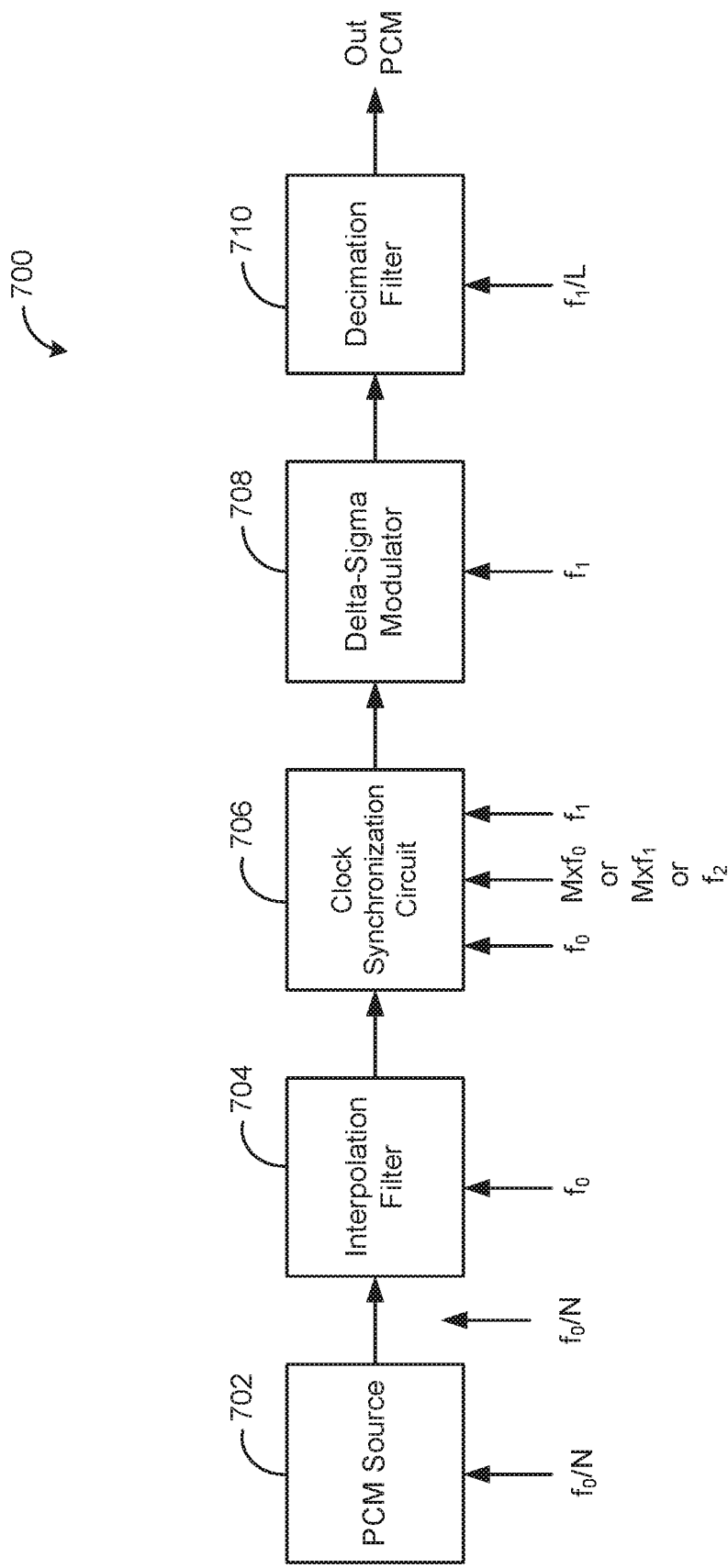
FIG. 7 illustrates a simplified block diagram of an example low power asynchronous sample rate conversion circuit for a Pulse-Code Modulation (PCM)-to-PCM conversion, in accordance with one or more embodiments.

FIG. 7 illustrates a simplified block diagram of an example low power asynchronous sample rate conversion circuit 700 for a PCM-to-PCM conversion, in accordance with one or more embodiments. In various embodiments, the low power asynchronous sample rate conversion circuit 700 includes modulator 702, interpolation filter 704, clock synchronization circuit 706, delta-sigma modulator 708 and decimation filter 710. In FIG. 7, the modulator 702 is coupled to an input to the interpolation filter 704, which is then coupled to an input to the clock synchronization circuit 706. The clock synchronization circuit 706 is then coupled to the delta-sigma modulator 708, which is then coupled to the decimation filter 710. Given that the interpolation filter 704, clock synchronization circuit 706, and delta-sigma modulator 708 correspond substantially to similar components in FIGS. 1, 2, 5 and 6, only components that are unique to FIG. 7 will be discussed for brevity of explanation. Not all of the depicted components may be used, however, and one or more implementations may include additional components not shown in the figure. Variations in the arrangement and type of the components may be made without departing from the scope of the claims set forth herein. Additional components, different components, or fewer components may be provided.

In FIG. 7, the modulator 702 may be implemented by a delta-sigma modulator that is adapted to produce a sampled signal sequence of multi-bit words at the first sample rate divided by a factor of N (depicted as "$f_0/N$"), where N is a positive integer. In this respect, the sampled signal is at a lower sample rate than the first sample rate (depicted as "$f_0$"). The interpolation filter 704 is coupled to the delta-sigma modulator and to an input to the clock synchronization circuit 706. The interpolation filter 704 is adapted to produce an interpolated signal at the first sample rate to the clock synchronization circuit 706 by interpolating the sampled signal by the factor of N. In some embodiments, the PCM words may be provided by other means such as playback from a storage unit or through a wireless link.

In contrast to FIG. 6, the decimation filter 710 of FIG. 7 is coupled to the output of the delta-sigma modulator 708 and is adapted to downsample the noise-shaped output sequence signal from the delta-sigma modulator 708 into a pulse code modulated signal (depicted by "Out PCM") by decimating the second sample rate by the factor of L (depicted as "$f_1/L$"). A typical use case of the embodiment in FIG. 7 is converting 44.1 kHz samples to 48 kHz samples.

The embodiment of FIG. 7 has similar use as the asynchronous sample rate converter by utilizing the high-speed conversion to reduce (or minimize) occurrences of unwanted aliasing and ensure high performance by the sample rate conversion. In various embodiments, the interpolation filter 704 and the decimation filter 710 may be implemented with multiplier-free structures for minimal power consumption.

Figure 8:
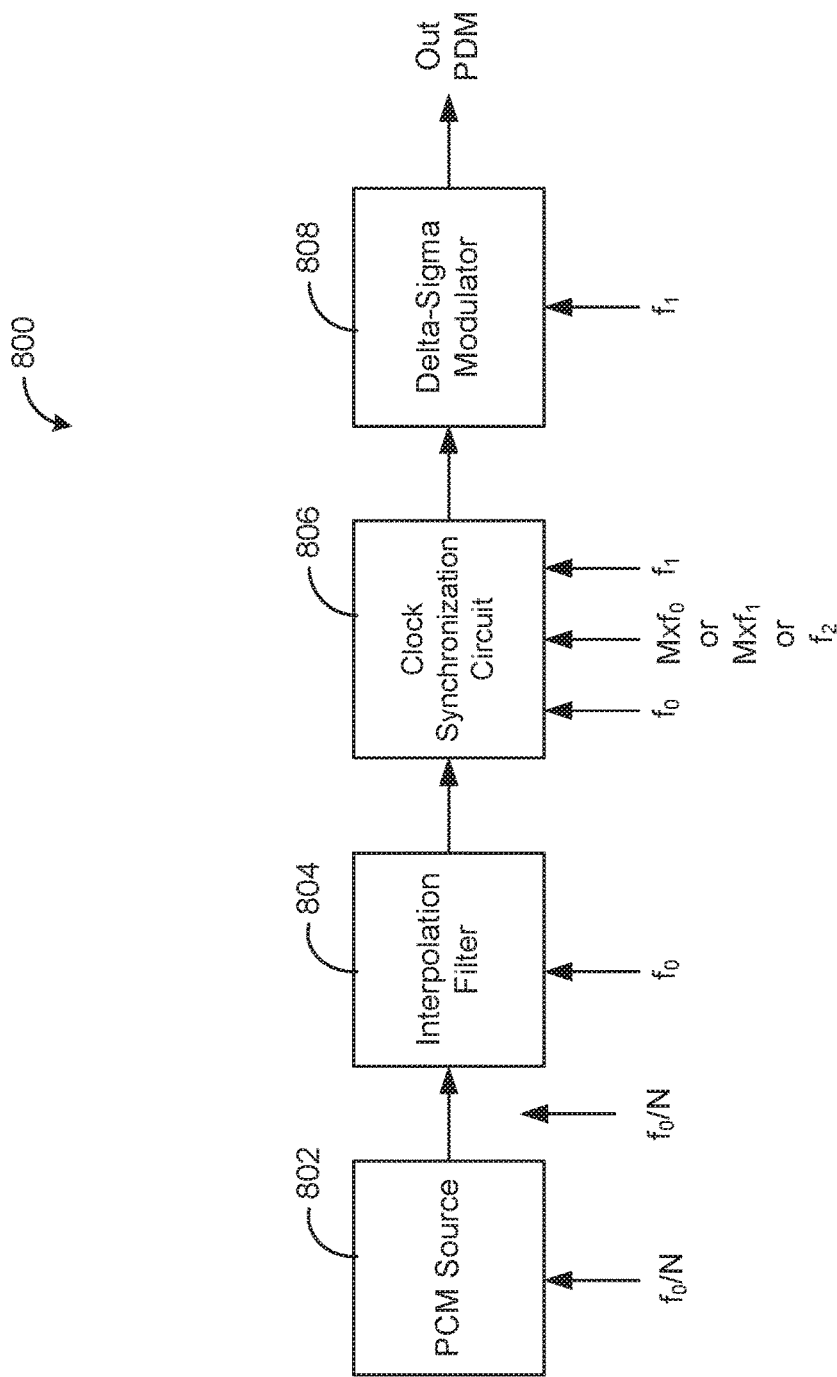
FIG. 8 illustrates a simplified block diagram of an example low power asynchronous sample rate conversion circuit for a PCM-to-PDM conversion, in accordance with one or more embodiments.

FIG. 8 illustrates a simplified block diagram of an example low power asynchronous sample rate conversion circuit 800 for a PCM-to-PDM conversion, in accordance with one or more embodiments. In various embodiments, the low power asynchronous sample rate conversion circuit 800 includes modulator 802, interpolation filter 804, clock synchronization circuit 806, and delta-sigma modulator 808. In FIG. 8, the modulator 802 is coupled to an input to the interpolation filter 804, which is then coupled to an input to the clock synchronization circuit 806. The clock synchronization circuit 806 may filter out values around rising clock edges, falling clock edges or both clock edges to avoid any problems with data integrity. The clock synchronization circuit 806 is then coupled to the delta-sigma modulator 808. Given that the modulator 802, the interpolation filter 804, clock synchronization circuit 806, and delta-sigma modulator 808 correspond substantially to similar components in FIGS. 1, 2, 5 and 7, only components that are unique to FIG. 8 will be discussed for brevity of explanation. Not all of the depicted components may be used, however, and one or more implementations may include additional components not shown in the figure. Variations in the arrangement and type of the components may be made without departing from the scope of the claims set forth herein. Additional components, different components, or fewer components may be provided.

The embodiment in FIG. 8 shows an example of converting a PCM signal to a PDM signal, which is not directly harmonically related. This may be used to avoid a fractional sample rate converter and simplify the topology of the low power asynchronous sample rate conversion circuit 800. The low power asynchronous sample rate conversion circuit 800 can provide lower power consumption compared to existing approaches, because all multipliers can be removed from the topology. In contrast to FIG. 7, if the output decimation filter is omitted, streams may be directly merged at a higher sample frequency, e.g. 3.072 MHz. In this example, the modulator 802 receives input signaling at a sample frequency of 48 kHz and the delta-sigma modulator 808 can output a noise-shaped output sequence for a PDM application at a particular sample frequency (e.g., 2.8224 MHz, which may not be a direct multiple of the sample frequency of 48 kHz).

Figure 9:
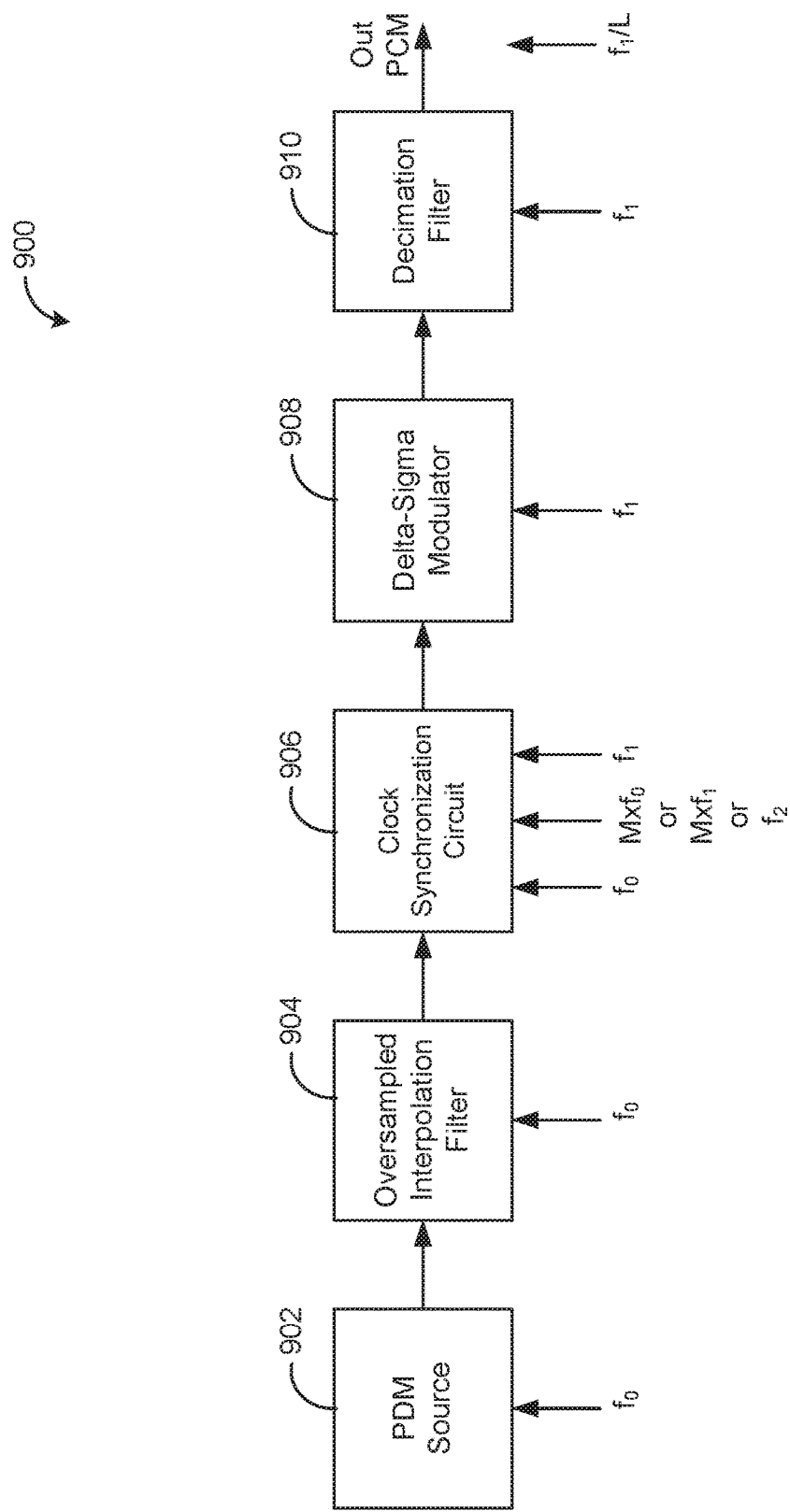
FIG. 9 illustrates a simplified block diagram of an example low power asynchronous sample rate conversion circuit for a PDM-to-PCM conversion, in accordance with one or more embodiments.

FIG. 9 illustrates a simplified block diagram of an example low power asynchronous sample rate conversion circuit 900 for a PDM-to-PCM conversion, in accordance with one or more embodiments. In various embodiments, the low power asynchronous sample rate conversion circuit 900 includes modulator 902, oversampled interpolation filter 904, clock synchronization circuit 906, delta-sigma modulator 908 and decimation filter 910. In FIG. 9, the modulator 902 is coupled to an input to the oversampled interpolation filter 904, which is then coupled to an input to the clock synchronization circuit 906. The clock synchronization circuit 906 is coupled to an input to the delta-sigma modulator 908, which is then coupled to the decimation filter 910. Given that the modulator 902, the oversampled interpolation filter 904, the clock synchronization circuit 906, and the delta-sigma modulator 908 correspond substantially to similar components in FIGS. 1, 2 and 5, only components that are unique to FIG. 9 will be discussed for brevity of explanation. Not all of the depicted components may be used, however, and one or more implementations may include additional components not shown in the figure. Variations in the arrangement and type of the components may be made without departing from the scope of the claims set forth herein. Additional components, different components, or fewer components may be provided.

In contrast to FIG. 5, the decimation filter 910 of FIG. 9 is coupled to an output of the delta-sigma modulator 908 and is adapted to downsample the noise-shaped output sequence signal from the delta-sigma modulator 908 at the second sample rate (depicted as "$f_1$") into a pulse code modulated signal (depicted by "Out PCM") with a lower sample rate by decimating the second sample rate by the factor of L (depicted as "$f_1/L$"). A typical use case of the embodiment in FIG. 9 is converting 3.000 MHz samples (e.g., Bluetooth time reference) to 48 kHz samples. For example, the low power asynchronous sample rate conversion circuit 900 may be implemented with Analog-to-Digital Converters (ADCs) from a sample frequency that is not directly related to the output sample frequency by an integer. Even though the sample rate conversion can be performed using a fractional sample rate converter, the topology depicted in FIG. 9 can result in a lower power consumption and higher performance for the same or lower silicon area. In various embodiments, the interpolation filter 904 and the decimation filter 910 may be implemented with multiplier-free structures for minimal power consumption.

Figure 10:
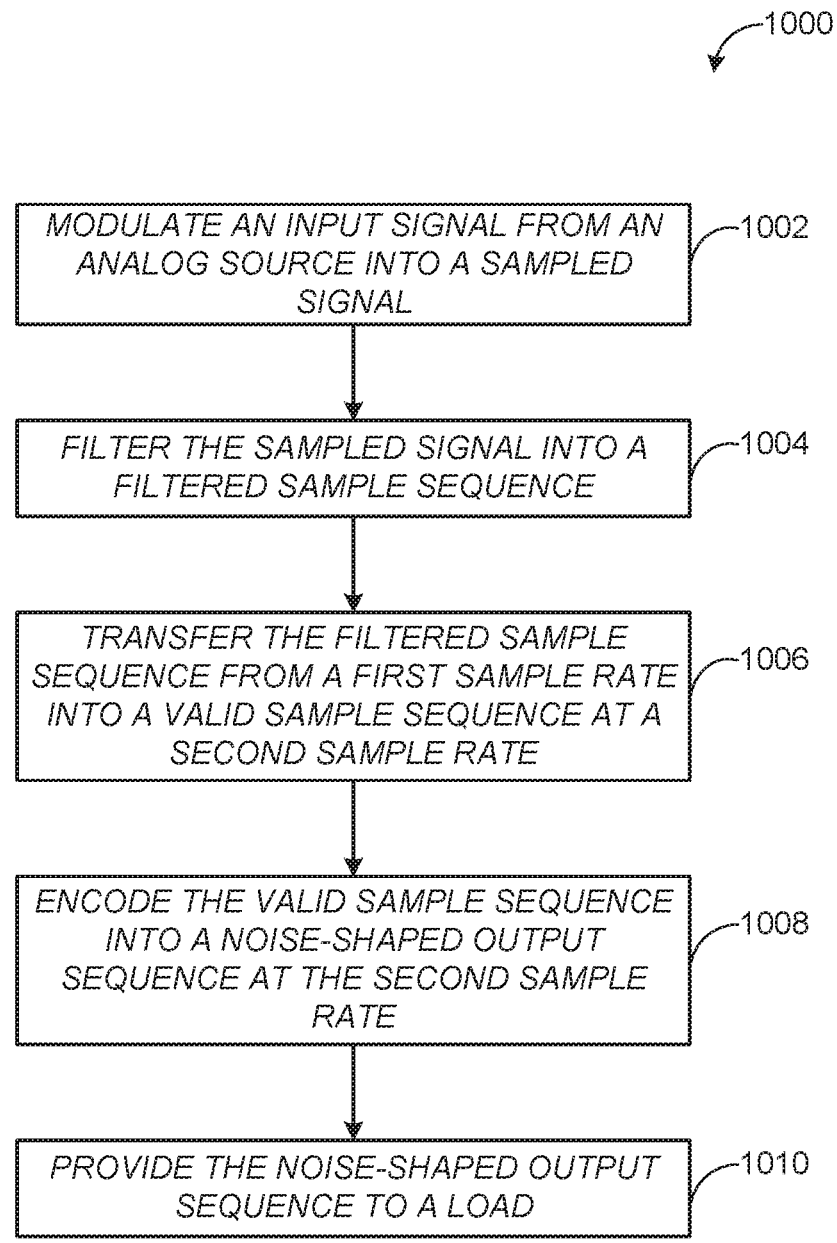
FIG. 10 illustrates a flow chart of an example process of sample rate conversion with noise shaping modulation, in accordance with one or more embodiments.

FIG. 10 illustrates a flow chart of an example process 1000 of converting sample rates with noise shaping modulation, in accordance with one or more embodiments. In some embodiments, the operations of FIG. 10 may be implemented with any combination of software instructions and/or electronic hardware (e.g., modulators, filters, latches, flip flops, or other analog and/or digital components). It should also be appreciated that any step, sub-step, sub-process, or block of process 1000 may be performed in an order or arrangement different from the embodiments illustrated by FIG. 10. For example, in other embodiments, one or more blocks may be omitted from or added to each individual process. Furthermore, block inputs, block outputs, various modulation signals, filter signals, clock synchronization signals, and/or noise-shaped signals may be stored to one or more memories prior to moving to a following portion of a corresponding process. Although process 1000 is described with reference to systems described in FIGS. 2, 4-9, process 1000 may be performed by other systems different from those systems and including a different selection of sample rate conversion systems.

The process 1000 starts at step 1002, where an input signal is modulated from an analog source into a sampled signal as a sequence of single bits or as a sequence of multi-bit words. In some examples, the input signal is modulated by a pulse-density modulator to produce the sequence of single bits. In other examples, the input signal is modulated by a delta-sigma modulator or reproduced from a storage unit or through other means, such as a wireless transmission, to produce the sequence of multi-bit words.

Next, at step 1004, the sampled signal is filtered into a filtered sample sequence by decimation and interpolation or by oversampled interpolation. In some examples, the sampled signal is filtered by a decimation filter followed by an interpolation filter to ensure the input sequence signal is band limited to reduce (or minimize) occurrences of unwanted aliasing when removing samples. In other examples, the sampled signal is filtered by an oversampled interpolation filter that is coupled to an output of a pulse density modulator and is adapted to remove out-of-band aliased images from the modulated signal using one or more internal delays and associated processing in the oversampled interpolation filter.

Subsequently, at step 1006, the filtered sample sequence is transferred from a first sample rate into a valid sample sequence comprising valid samples with invalid samples being excluded from the valid sample sequence. In some aspects, the valid sample sequence is sampled at a second sample rate different from the first sample rate. For example, to eliminate (or at least reduce) the number of transfer errors prior to sample rate conversion, the filtered sample sequence and accompanying input clock line may be sampled at a faster rate than required to ensure the filtered sample sequence line has been stable for more than one clock period. This would validate that subsequent samples have satisfied all setup/hold time conditions, ensuring the output of valid word values.

Next, at step 1008, the valid sample sequence is encoded into a noise-shaped output sequence at the second sample rate with quantization noise suppressed from the valid sample sequence. For example, after the clock synchronization operation at step 1006 has obtained a sequence of valid values sampled at another clock rate (e.g., second sample rate) than the output rate in the first clock domain (e.g., first sample rate), the noise shaping loop operation can be used to filter out discontinuities in the valid sample sequence to ensure the noise-shaped output sequence does not contain any unwanted noise (e.g., signal spikes).

Subsequently, at step 1010, the noise-shaped output sequence is provided to a load. For example, the noise-shaped output sequence represented as a sample rate converted audio signal may be provided to an audio processing system and the sent to an amplifier, digital-to-analog converter and speaker serving as the load.

Where applicable, various embodiments provided by the present disclosure may be implemented using hardware, software, or combinations of hardware and software. Also, where applicable, the various hardware components and/or logic components set forth herein may be combined into composite components comprising software, hardware, and/or both without departing from the scope of the present disclosure. Where applicable, the various hardware components and/or logic components set forth herein may be separated into sub-components comprising software, hardware, or both without departing from the scope of the present disclosure. In addition, where applicable, it is contemplated that software components may be implemented as hardware components and vice versa.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. For example, although the low delay decimators and low delay interpolators disclosed herein are described with reference to adaptive noise cancellation systems, it will be appreciated that the low delay filters disclosed herein may be used in other signal processing systems. Having thus described embodiments of the present disclosure, persons of ordinary skill in the art will recognize that changes may be made in form and detail without departing from the scope of the present disclosure. Thus, the present disclosure is limited only by the claims.

What is claimed is:

1. A system comprising:
   a modulation source configured to modulate an input analog signal into an input sample sequence; and
   a clock synchronization circuit configured to receive the input sample sequence at a first sample rate and generate a valid sample sequence that is sampled at a second sample rate different from the first sample rate, the valid sample sequence comprising valid samples from a registered sequence that is sampled at an oversampled rate greater than the first sample rate with invalid samples in the registered sequence being excluded from the valid sample sequence.

2. The system of claim 1, further comprising:
   a noise shaping circuit coupled to the clock synchronization circuit and configured to encode the valid sample sequence into a noise-shaped output sequence at the second sample rate by suppressing quantization noise from the valid sample sequence.

3. The system of claim 2, wherein the clock synchronization circuit comprises:
   a plurality of registers connected in series and configured to sample the input sample sequence at the oversampled rate for successive clock edges to provide the registered sequence; and
   a sequence circuit coupled to the plurality of registers and configured to detect transitions in values of the registered sequence and identify the values at the transitions as the invalid samples for filtration.

4. The system of claim 3, wherein the sequence circuit comprises:
   a sequence detect circuit configured to detect the invalid samples at a first clock edge of the successive clock edges and the valid samples at a second clock edge of the successive clock edges that is subsequent to the first clock edge; and
   a sequence filter configured to filter the invalid samples with the valid samples being passed to the valid sample sequence.

5. The system of claim 3, wherein the plurality of registers is clocked at the oversampled rate and the sequence circuit is clocked at the second sample rate.

6. The system of claim 2, wherein the noise shaping circuit comprises a delta-sigma modulator, wherein the delta-sigma modulator is a kth-order delta-sigma modulator, where k is greater than 1.

7. The system of claim 2, wherein the modulation source comprises a pulse density modulator configured to modulate the input analog signal into a sampled signal as a sequence of single bits at the first sample rate.

8. The system of claim 7, further comprising:
   a pre-amplifier coupled to an input to the pulse density modulator and configured to amplify the input analog signal into an amplified analog signal, wherein the pulse density modulator modulates the amplified analog signal into the sampled signal; and
   an oversampled interpolation filter coupled to an output of the pulse density modulator and configured to remove out-of-band aliased images from the sampled signal using one or more internal delays in the oversampled interpolation filter that operate at different sample frequencies.

9. The system of claim 8, further comprising a decimation filter coupled to the noise shaping circuit and configured to downsample the noise-shaped output sequence at the second sample rate and provide a pulse code modulated signal with a downsampled rate by decimating the second sample rate by a factor of L, where L is a positive integer.

10. The system of claim 7, further comprising:
a decimation filter coupled to the pulse density modulator and configured to downsample the sampled signal into a decimated signal by decimating the first sample rate by a factor of N, where N is a positive integer; and
an interpolation filter coupled to the decimation filter and to an input to the clock synchronization circuit and configured to produce the input sample sequence at the first sample rate by interpolating the decimated signal by the factor of N.

11. The system of claim 2, further comprising:
a delta-sigma modulator configured to produce a sampled signal as a sequence of multi-bit words at the first sample rate divided by a factor of N, where N is a positive integer; and
an interpolation filter coupled to the delta-sigma modulator and to an input to the clock synchronization circuit and configured to produce the input sample sequence at the first sample rate by interpolating the sampled signal by the factor of N.

12. The system of claim 11, further comprising a decimation filter coupled to the noise shaping circuit and configured to downsample the noise-shaped output sequence into a pulse code modulated signal by decimating the second sample rate by a factor of L, where L is a positive integer.

13. A sample rate converter comprising:
a modulation source configured to modulate an input analog signal into an input sample sequence;
a clock synchronization circuit configured to receive the input sample sequence at a first sample rate and generate a valid sample sequence that is sampled at a second sample rate different from the first sample rate, the valid sample sequence comprising valid samples from a sampled sequence that is sampled at an oversampled rate greater than the first sample rate with invalid samples in the sampled sequence being excluded from the valid sample sequence; and
a noise shaping circuit coupled to the clock synchronization circuit and configured to encode the valid sample sequence into a noise-shaped output sequence at the second sample rate by suppressing quantization noise from the valid sample sequence.

14. The sample rate converter of claim 13, wherein the modulation source is a pulse density modulator configured to produce a modulated signal from the input analog signal.

15. The sample rate converter of claim 14, further comprising:
a pre-amplifier coupled to an input to the pulse density modulator and configured to amplify the input analog signal into an amplified analog signal, wherein the pulse density modulator modulates the amplified analog signal into the modulated signal; and
an oversampled interpolation filter coupled to an output of the pulse density modulator and configured to produce the input sample sequence by removing out-of-band aliased images from the modulated signal using one or more internal delays in the oversampled interpolation filter that operate at different sample frequencies.

16. The sample rate converter of claim 15, further comprising a decimation filter coupled to the noise shaping circuit and configured to downsample the noise-shaped output sequence at the second sample rate and provide a pulse code modulated signal with a downsampled rate by decimating the second sample rate by a factor of L, where L is a positive integer.

17. The sample rate converter of claim 14, further comprising:
a decimation filter coupled to the pulse density modulator and configured to downsample the modulated signal into a decimated signal by decimating the first sample rate by a factor of N, where N is a positive integer; and
an interpolation filter coupled to the decimation filter and to an input to the clock synchronization circuit and configured to produce the input sample sequence at the first sample rate by interpolating the decimated signal by the factor of N.

18. The sample rate converter of claim 13, wherein the modulation source is a delta-sigma modulator that is configured to produce a modulated signal from the input analog signal, and further comprising an interpolation filter coupled to the delta-sigma modulator and to an input to the clock synchronization circuit and configured to produce the input sample sequence at the first sample rate by interpolating the modulated signal by a factor of N, where N is a positive integer.

19. The sample rate converter of claim 18, further comprising a decimation filter coupled to the noise shaping circuit and configured to downsample the noise-shaped output sequence into a pulse code modulated signal by decimating the second sample rate by a factor of L, where L is a positive integer.

20. A method comprising:
modulating an input signal from an analog source into a modulated signal as a sequence of single bits or as a sequence of multi-bit words;
filtering the modulated signal into a filtered sample sequence by decimation and interpolation or by oversampled interpolation;
transferring the filtered sample sequence from a first sample rate into a valid sample sequence comprising valid samples with invalid samples being excluded from the valid sample sequence, the valid sample sequence being sampled at a second sample rate different from the first sample rate;
encoding the valid sample sequence into a noise-shaped output sequence at the second sample rate with quantization noise suppressed from the valid sample sequence; and
providing the noise-shaped output sequence to a load.

* * * * *